United States Patent [19]
Magnusson et al.

[11] Patent Number: 6,154,480
[45] Date of Patent: Nov. 28, 2000

[54] VERTICAL-CAVITY LASER AND LASER ARRAY INCORPORATING GUIDED-MODE RESONANCE EFFECTS AND METHOD FOR MAKING THE SAME

[75] Inventors: Robert Magnusson; Preston P. Young; Dongho Shin, all of Arlington, Tex.

[73] Assignee: Board of Regents, The University of Texas System, Austin, Tex.

[21] Appl. No.: 09/073,579

[22] Filed: May 6, 1998

Related U.S. Application Data

[60] Provisional application No. 60/060,835, Oct. 2, 1997.
[51] Int. Cl.$^7$ .................................................. H01S 3/08
[52] U.S. Cl. ................ 372/96; 372/96; 372/92; 372/45; 372/98; 372/99; 372/64; 372/102
[58] Field of Search .............................. 372/96, 92, 45, 372/98–99, 64, 102

[56] References Cited

U.S. PATENT DOCUMENTS

| | | |
|---|---|---|
| 5,216,680 | 6/1993 | Magnusson et al. . |
| 5,264,715 | 11/1993 | Guenter et al. ............................ 257/98 |
| 5,598,300 | 1/1997 | Magnusson et al. . |
| 5,625,729 | 4/1997 | Brown ....................................... 385/31 |
| 5,783,319 | 7/1998 | Reisfeld et al. ........................... 428/690 |

OTHER PUBLICATIONS

Alavi, "Molecular Beam Epitaxy, " In *Handbook of Compound Semiconductors*, P. H. Holloway and G. E. McGuire, Eds., pp. 84–169, Noyes Publications 1995.

Avrutsky and Sychugov, "Reflection of a beam of finite size from a corrugated waveguide," J. Mod. Opt. 36, 1527–1539, 1989.

Chua et al., "Indium tin oxide transparent electrodes for broad–area top–emitting vertical–cavity lasers fabricated using a single lithography step," IEEE Photonics Tech. Lett. 9, 551–553, 1997.

Gourley and Warren, "Surface–emitting semiconductor laser structures fabricated by microlithography," J. Nonlinear Opt. Phys. and Materials 4, 27–81, 1995.

Jewell et al., "Vertical–cavity surface–emitting lasers: Design, growth, fabrication, characterization," IEEE J. Quantum Electron. 27, 1332–1346, 1991.

(List continued on next page.)

*Primary Examiner*—Frank G. Font
*Assistant Examiner*—Delma R. Flores Ruiz
*Attorney, Agent, or Firm*—Fulbright & Jaworski LLP

[57] ABSTRACT

A new class of vertical-cavity lasers (VCLs) is disclosed. Conventional VCLs contain an active region enclosed by Bragg-mirror stacks of 30–100 quarter-wave layers. The new VCLs can be fabricated without Bragg mirrors by replacing them with efficient diffractive (guided-mode resonance (GMR)) mirrors with much fewer layers, for example, two or three layers. This application provides optical power flow across and along the VCL gain region, thereby greatly increasing the laser efficiency and reducing the threshold mirror reflectance needed for lasing, relative to conventional VCLs. Theoretical and experimental results show that GMR mirrors exhibit high reflectance (theoretically, 100%; experimentally, in excess of 90%) in a narrow spectral band with well-defined polarization states. When incorporated in VCLs, the GMR mirrors yield single-mode, narrow-line, highly-polarized output light. The GMR-VCL is independent of any particular material system. An example fabrication process of GaAs-based VCLs includes molecular-beam epitaxial growth of the basic planar structure and multiple-quantum-well (InGaAs/GaAs for 980 nm wavelength) active layers, interferometric recording of the GMR grating, lithographic and reactive-ion-etch definition of individual VCL elements, and metallization and contacting. GMR-VCL arrays can also be fabricated; the diffractive element will phase-lock the individual lasers to produce exceptionally high optical power and coherence. GMR-VCL technology holds high potential to provide low-cost, high-speed sources for fiber optic communications and other applications.

32 Claims, 10 Drawing Sheets

OTHER PUBLICATIONS

Magnusson and Wang, "New principle for optical filters," Appl. Phys. Lett. 61, 1022–1024, 1992.

Margalit et al., "Vertical cavity lasers for telecom applications," IEEE Communication Magazine, 164–170, 1997.

Wang and Magnusson, "Design of waveguide–grating filters with symmetrical line shapes and low sidebands," Optics Lett. 19, 919–921, 1994.

Yariv, "Optical Electronics," *In Modern Communications*, 5th Ed., Oxford University Press, New York, p. 628–636, 1997.

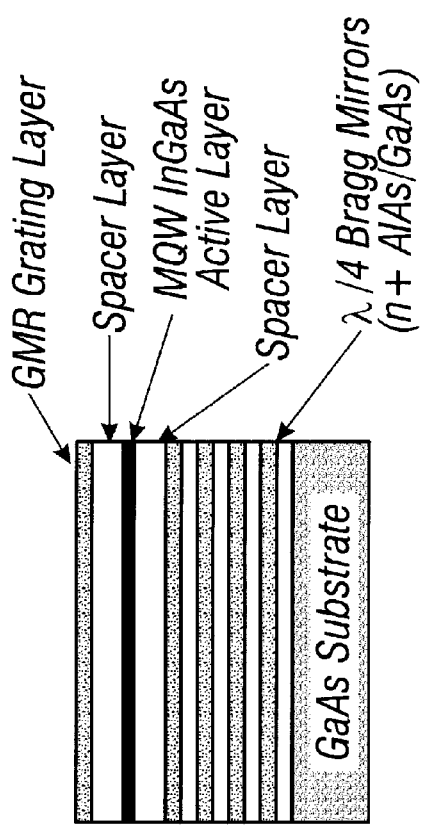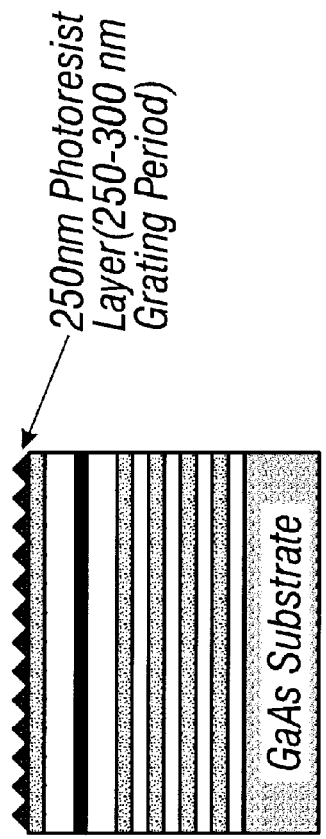

Reactive-Ion-Etch Grating Layer
Planarize with p-Type GaAs and
p+Doped Layer for Contact Etch Define VCL Output Apertures
and Contact Metallization

VERTICAL-CAVITY LASER AND LASER ARRAY INCORPORATING GUIDED-MODE RESONANCE EFFECTS AND METHOD FOR MAKING THE SAME

RELATED APPLICATION

This application claims the benefit of U.S. Provisional Application No. 60/060,835, filed Oct. 2, 1997.

FIELD OF THE INVENTION

The present invention relates to a vertical-cavity laser in general, and more specifically to a vertical-cavity laser and laser array incorporating guided-mode resonance effects and a method for making the same.

BACKGROUND OF THE INVENTION

FIG. 1 illustrates a conventional GaAs-based vertical-cavity surface-emitting laser (VCL) 10 as known in the prior art. The epitaxial design allows the basic VCL Bragg-stack mirrors 12 & 14 and active gain layers to be grown during a single closely-controlled crystal growth process. The active region 24 contains one or more quantum wells (QW) with a typical thickness of ~8 nm placed between ~10 nm barrier layers. The active region 24 is surrounded by spacer layers 16 to provide optimal position of the active layer within the resonant cavity. Electrical VCL excitation occurs by injecting current through the active (QW) region causing electron-hole recombination and subsequent photon emission. Various methods for current confinement within the active region include proton implantation, etched mesa, dielectric aperturing, or buried heterostructure designs [Margalit et al. 1997; Jewell et al. 1991; Gourley et al. 1995]. Typical laser diameters range from a few microns for single mode lasers to 50 $\mu$m or larger for multi-mode lasers. Electrical contacts can be implemented, for example, by forming heavily doped n- and p-type layers 18 & 19 on the top and bottom surfaces followed by deposition of thin metal layers (Au, Al). Alternately, contact layers can be formed using optically transparent conducting materials such as indium-tin-oxide (ITO) [Chua et al. 1997].

Conventional current injection VCLs utilize both n-type and p-type multilayer Bragg-stack mirrors formed by pairs of alternating high and low refractive index layers. Each typical semiconductor Bragg-stack mirror requires anywhere between 30 and 100 layers depending on the specific semiconductor material system used to achieve the high reflectivity required for laser operation. One disadvantage of the conventional Bragg-stack mirror configuration is that between 60 to over 200 high quality layers may be required to fabricate a complete VCL.

In a VCL, it is established physics that the small thickness of the gain regions limits the amplification of the oscillating light intensity obtained with each pass through the active region. In contrast, for in-plane or edge emitting lasers, the gain length can be hundreds of micrometers. For initiation of lasing oscillation, the round trip gain must equal round trip loss. Therefore, the mirror transmission loss in a conventional VCL must be exceedingly small, requiring highly reflective dielectric mirrors with low material absorptive losses. Typically, for conventional VCLs, this reflectivity must exceed 99%, with values approaching 99.9% often used. As an example, for light output at wavelength $\lambda$=850 or 980 nm with AlAs/GaAs Bragg mirrors (layer refractive-index difference $\Delta$n=0.57), ~30 periods (60 layers) are required to achieve a 99.5% reflectivity [Margalit et al. 1997].

Despite the rigid requirements outlined above, VCLs are promising sources for optical communications if these problems can be overcome. In particular, the laser output of a VCL matches the circular aperture of optical communications fibers. Moreover, VCLs can be more cost effective and have better performance than in-plane and edge-emitting lasers.

Research work has previously been done on diffractive coupling and on guided-mode resonance (GMR) filters. For example, applying exact electromagnetic analysis to optical multilayer structures containing diffractive and waveguide layers, sharp waveguide-coupling resonance phenomena were found and their origins were explained [Magnusson et al. 1992]. Combining resonant waveguide gratings with thin-film antireflection layers yields reflection filters (i.e., the useful spectrum reflected as in a mirror) with high efficiency (~100%), arbitrarily narrow passbands, polarization selectivity, symmetric line shapes, and extended low sidebands [Wang et al 1994]. Thus, reflection GMR filters with efficiencies exceeding 90% have been fabricated.

U.S. Pat. No. 5,216,680 by Magnusson et al. discloses optical GMR filters and suggests that they can be placed within a laser. However, this patent does not address VCLs and does not contemplate or suggest any such structure.

U.S. Pat. No. 5,598,300 by Magnusson et al. discloses ideal or near ideal filters for reflecting or transmitting electromagnetic waves using GMR effects. This patent provides detailed teachings of various structures of GMR filters and how to design these filters for desired performance characteristics. The patent suggests that these filters could be used as mirrors and phase-locking elements for VCLs. However, the patent does not provide any teaching or suggestion of how to implement such an application.

The present invention addresses the problems and shortcomings in the prior art by providing more efficient VCLs that are simple to manufacture, that have high gain with reduced threshold current and reduced number of layers, and that allow for lower mirror reflectivity.

SUMMARY OF THE INVENTION

The present invention relates to a new class of vertical-cavity lasers (VCL) with high gain and low lasing thresholds. Efficient waveguide-mode resonance (GMR) mirrors replace the traditional multilayer VCL Bragg-stack mirrors. These GMR mirrors contain far fewer layers than the traditional multilayer Bragg-stack mirrors. The use of GMR mirrors fundamentally provides optical power flow not only across the active medium layer but also along the active region due to diffractive coupling. The round-trip gain is thereby greatly increased (over that of an ordinary VCL) resulting in higher laser efficiency and lower mirror reflectivity required for lasing. Furthermore, fundamental physics of the GMR concept allows only a single laser mode to be supported at resonance for any laser diameter. As the GMR mirror achieves high reflectivity at resonance, the laser wavelength is locked at the resonance wavelength defined by the period of the diffractive element. Furthermore, the GMR structure provides polarized, single-mode laser output largely independent of VCL cavity dimensions and operating power.

These and other features, and advantages, will be more clearly understood from the following detailed description taken in conjunction with the accompanying drawings. It is important to point out that the illustrations may not necessarily be drawn to scale, and that there are other embodiments of the present invention which may not be specifically

BRIEF DESCRIPTION OF THE DRAWINGS

FIGS. 9–13 illustrate steps for making a GMR-VCL, using GaAs as an example material system, in accordance with the present invention.

DETAILED DESCRIPTION OF PREFERRED EMBODIMENTS

A new class of VCLs that do not rely on Bragg-stack mirrors for their operation is provided by the present invention. Resonating diffractive waveguide elements (GMR mirrors) that have been shown to reflect light with high efficiency and in a narrow spectral band (i.e., a filter) are used instead. For VCL applications, the high efficiency, controllable bandwidth, and high degree of polarization are key GMR mirror features.

In particular, the vertical geometry of VCLs implies a small active region volume and a lowered threshold current. The very short cavities of VCLs typically yield single-longitudinal mode output spectra. The spectral purity associated with a single longitudinal mode implies low dispersion and thus high data transmission rates. By scaling down the lateral dimensions of conventional VCLs, a single transverse-mode laser beam with circular shape, Gaussian intensity profile, and low divergence can be obtained. This circular beam ideally matches the circular aperture of optical communications fibers. While VCLs according to the present invention can be of any arbitrary dimension, they preferably will have apertures in the range of approximately 5–2000 μm.

The following references, to the extent that they provide exemplary procedural or other details supplementary to those set forth herein, especially on the GMR effects and detailed design of GMR grating structures, are specifically incorporated herein by reference.

1. U.S. Pat. No. 5,598,300, entitled "Efficient Bandpass Reflection and Transmission Filters with Low Sidebands Based on Guided-Mode Resonance Effects," by Magnusson et. al., issued on Jan. 28, 1997.
2. U.S. Pat. No. 5,216,680, entitled "Optical Guided-Mode Resonance Filter," by Magnusson et. al, issued on Jun. 1, 1993.

Figure 1:
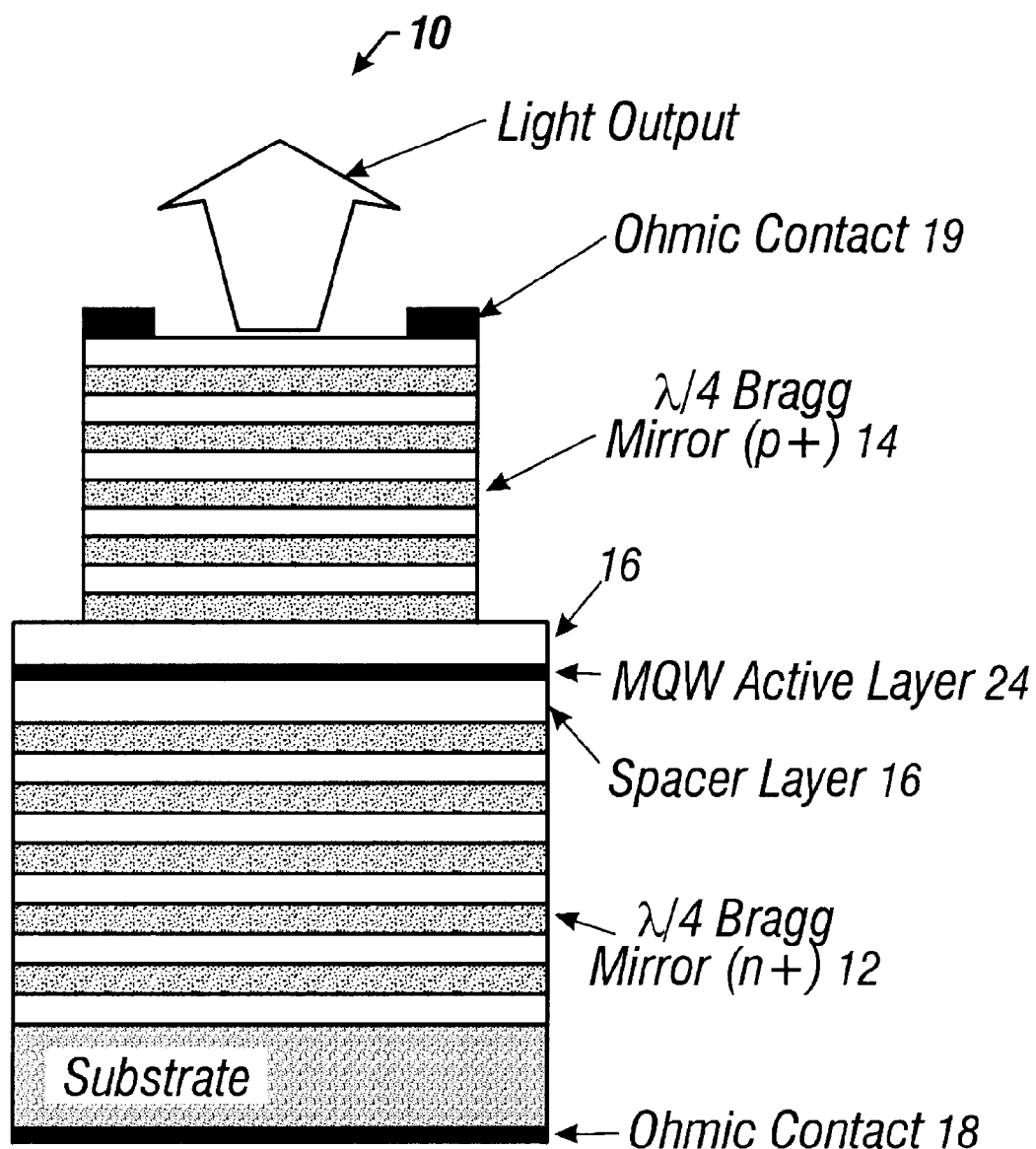
FIG. 1 illustrates, in cross-section, a typical VCL as known in the prior art.
Figure 2:
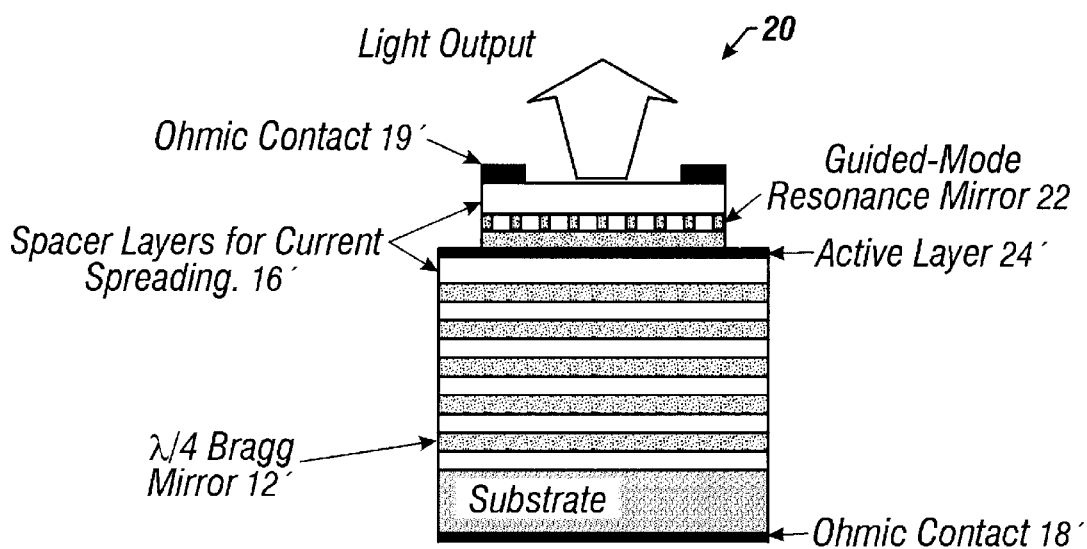
FIG. 2 illustrates, in cross-section, a GMR-VCL, in a first embodiment of the present invention.

FIG. 2 illustrates, in cross-section, a hybrid GMR-VCL 20, in a first embodiment of the present invention. A GMR reflector 22 or mirror is used in this first embodiment to replace one of the conventional VCL Bragg-stack mirrors. The hybrid device of FIG. 2 utilizes current well-proven VCL technology and is especially suitable for both proof-of-concept lasers utilizing GMR-mirrors and as a development structure for multiple-wavelength laser arrays. The spacer layers 16' provide current spreading over the active region 24' to produce laser population inversion and photon amplification, and serve to favorably position the active region within the vertical resonant cavity formed by the mirrors 12' and 22. Furthermore, electrical contacts may be implemented as illustrated to provide low-resistance interfaces between electrically conductive layers of materials with dissimilar work functions, such as typically needed between a metal and a semiconductor material. The GMR mirror 22 can contain as few as 2 to 3 layers, as compared to the traditional Bragg-stack mirror (40 to 60 layer for GaAs VCLs), and still retain the spectral reflectance characteristics required for lasing. This can be seen in FIGS. 3 & 4.

Figure 3:
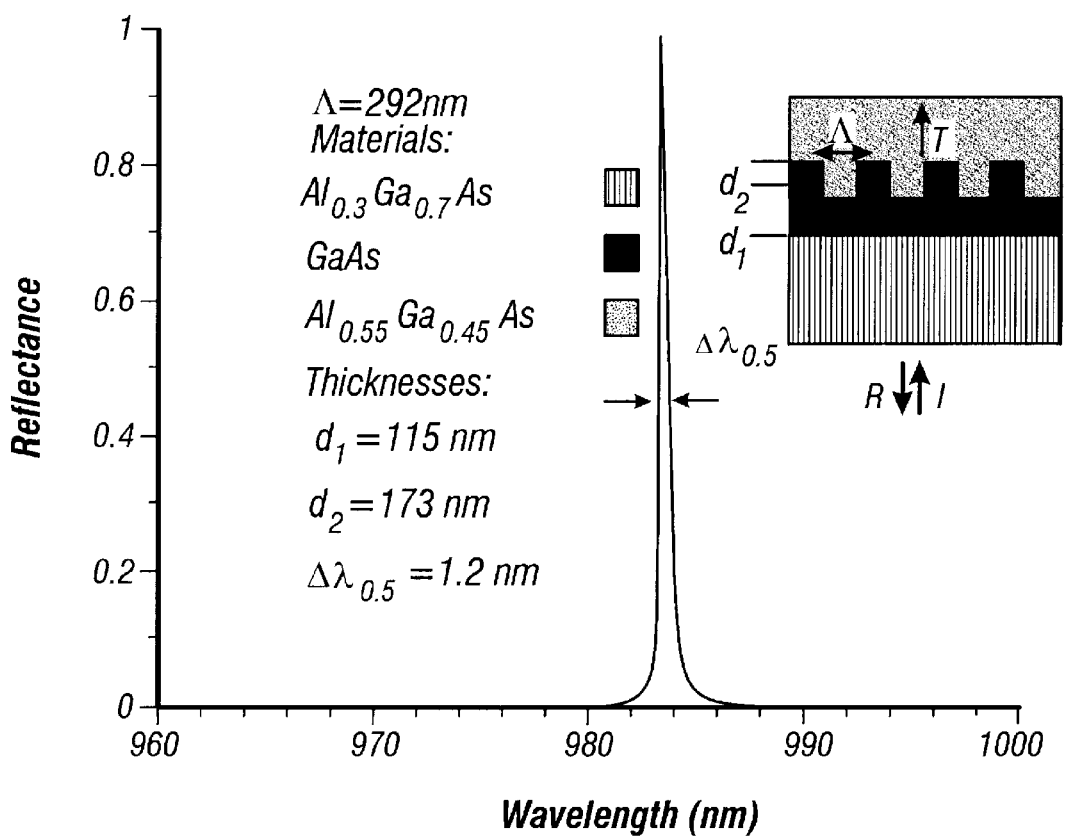
FIG. 3 is a graph illustrating the spectral reflectance of a 2-layer GMR mirror.
Figure 4:
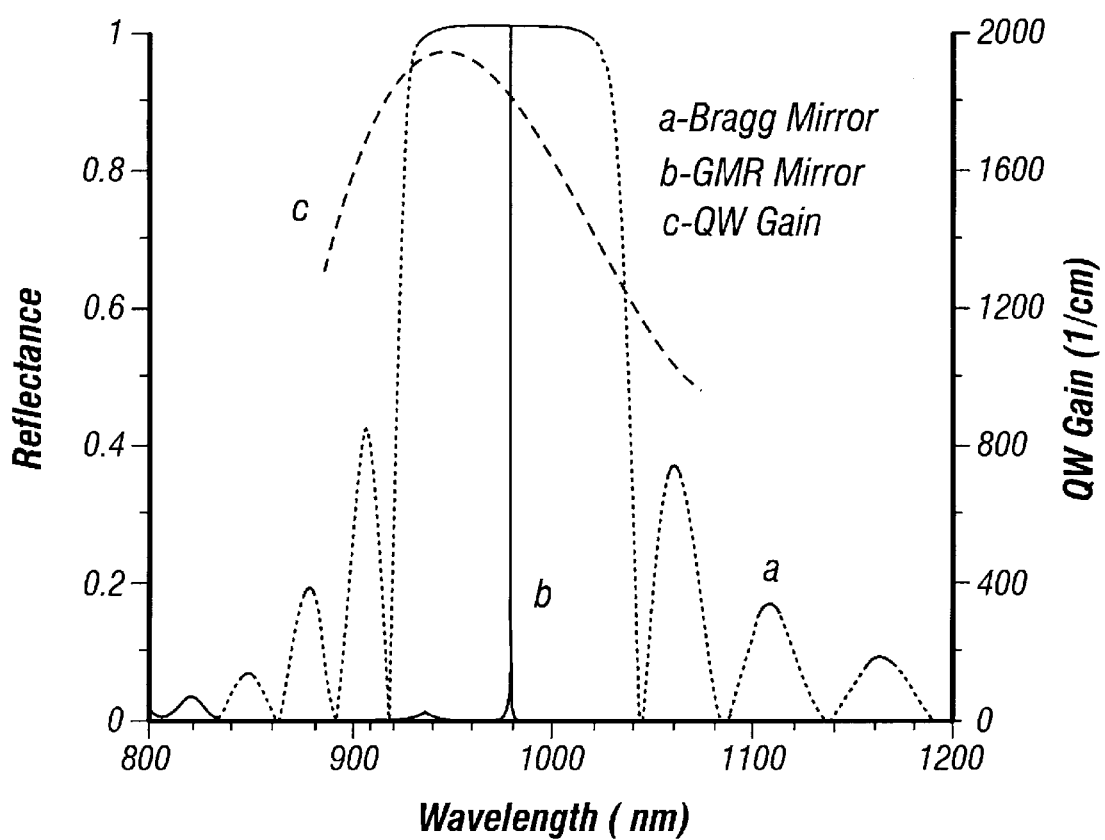
FIG. 4 is a graph comparing the TE-polarization spectral reflectance of a 42-layer Bragg-stack mirror versus a 2-layer GMR mirror, and a typical gain curve for a QW active region.

Specifically, FIG. 3 illustrates a calculated GMR mirror spectral response and corresponding design parameters for a GaAs-based VCL. A narrow-line, high-efficiency (100% theoretical value), polarized, spectral response is illustrated in FIG. 3 for a two-layer example structure. Furthermore, FIG. 4 shows that the GMR and Bragg-stack mirrors of the hybrid GMR-VCL can be designed to effectively overlap spectrally in a favorable part of the QW gain region thus yielding a working hybrid GMR-VCL. By varying the GMR mirror parameters for individual lasers, a wide range of wavelengths can be obtained from lasers produced on a single substrate with a common Bragg-stack mirror and active layers.

Elimination of the Bragg-stack mirror radically reduces the number of layers in the VCL architecture. However, another benefit of this approach goes far beyond reducing the number of VCL layers: Since the guided-mode resonance occurs on phase-matching of incident light by the grating to a waveguide, it is possible to construct this new VCL such that the oscillating laser light couples to a (leaky) waveguide mode that propagates along the gain region. Employing a simplified photon model and assuming 5 QWs, 10 nm thick each, in the waveguide (gain) region, the single-pass gain length is 50 nm for an ordinary VCL versus ~20,000 nm for a GMR-VCL.

Estimate of the Single-Pass Gain of GMR-VCLs

Figure 15:
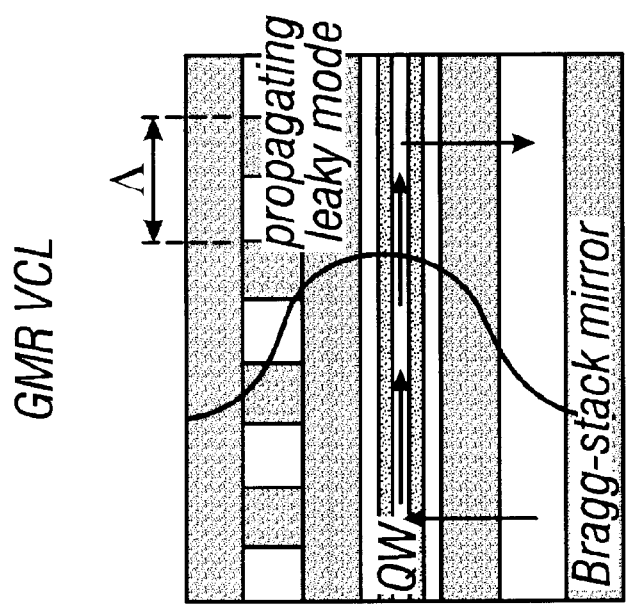
FIG. 15 illustrates a simplified photon picture for a GMR-VCL.
Figure 14:
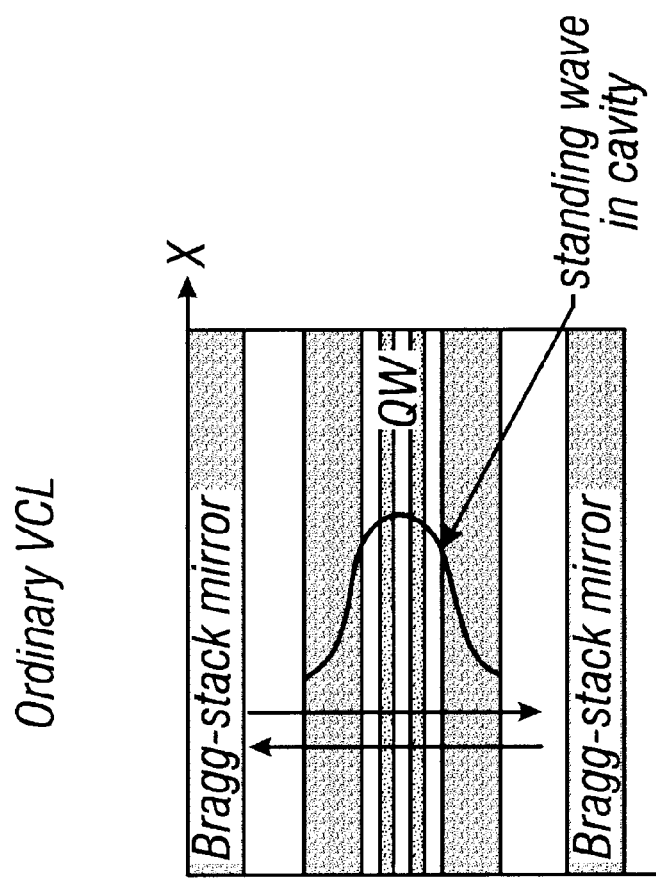
FIG. 14 illustrates a simplified photon picture for an ordinary VCL.

FIGS. 14 & 15 illustrate a simplified photon picture. In ordinary VCLs, the photon travels orthogonal to the quantum-wells. In GMR-VCLs, it travels across and along the QW gain region.

Leaky mode varies as $\sim\exp[-\alpha_r x]$

Define leaky mode decay length $L_r=1/\alpha_r \approx$ photon propagation path length where, $\alpha_r=4\pi\Delta\lambda/\Lambda\lambda$ (Approximation based on small grating modulation) [Avrutsky et al. 1989].

For $\lambda$(wavelength)=982 nm, $\Lambda$ (period)=292 nm, $\Delta\lambda$ (linewidth)=1.2 nm → $L_r=1/\alpha_r \approx 1.9\times 10^4$ nm=19 μm~diameter of VCL Required mirror intensity reflectance $R=\exp[-2\gamma L_{r,\mathit{eff}}]$ [Yariv 1997].

The gain $\lambda(@980\text{ nm}) \approx 1600\text{ cm}^{-1}$, (as given in FIG. 4), $L_{r,\mathit{eff}} = cL_r$, where c is a coefficient accounting for the superposition between the mode profile and quantum-well gain region; $c \approx 0.05$ estimated as typical.

| c | $L_r$ (nm) | $L_{r,\text{eff}}$ (nm) | R (%) |
|---|---|---|---|
| 0.500 | $1.9 \times 10^4$ | $0.950 \times 10^4$ | 4.80 |
| 0.300 | $1.9 \times 10^4$ | $0.633 \times 10^4$ | 13.2 |
| 0.100 | $1.9 \times 10^4$ | $1.900 \times 10^3$ | 54.4 |
| 0.050* | $\mathbf{1.9 \times 10^4}$ | $\mathbf{0.950 \times 10^3}$ | 73.8 |
| 0.010 | $1.9 \times 10^4$ | $1.900 \times 10^2$ | 94.1 |
| 0.005 | $1.9 \times 10^4$ | $0.950 \times 10^2$ | 97.0 |
| 0.001 | $1.9 \times 10^4$ | $1.900 \times 10^1$ | 99.4 |

This high-gain configuration allows mirror reflectivities to fall significantly (as low as 75% for typical values) since the mirror transmission losses are efficiently compensated by this high gain.

Figure 5:
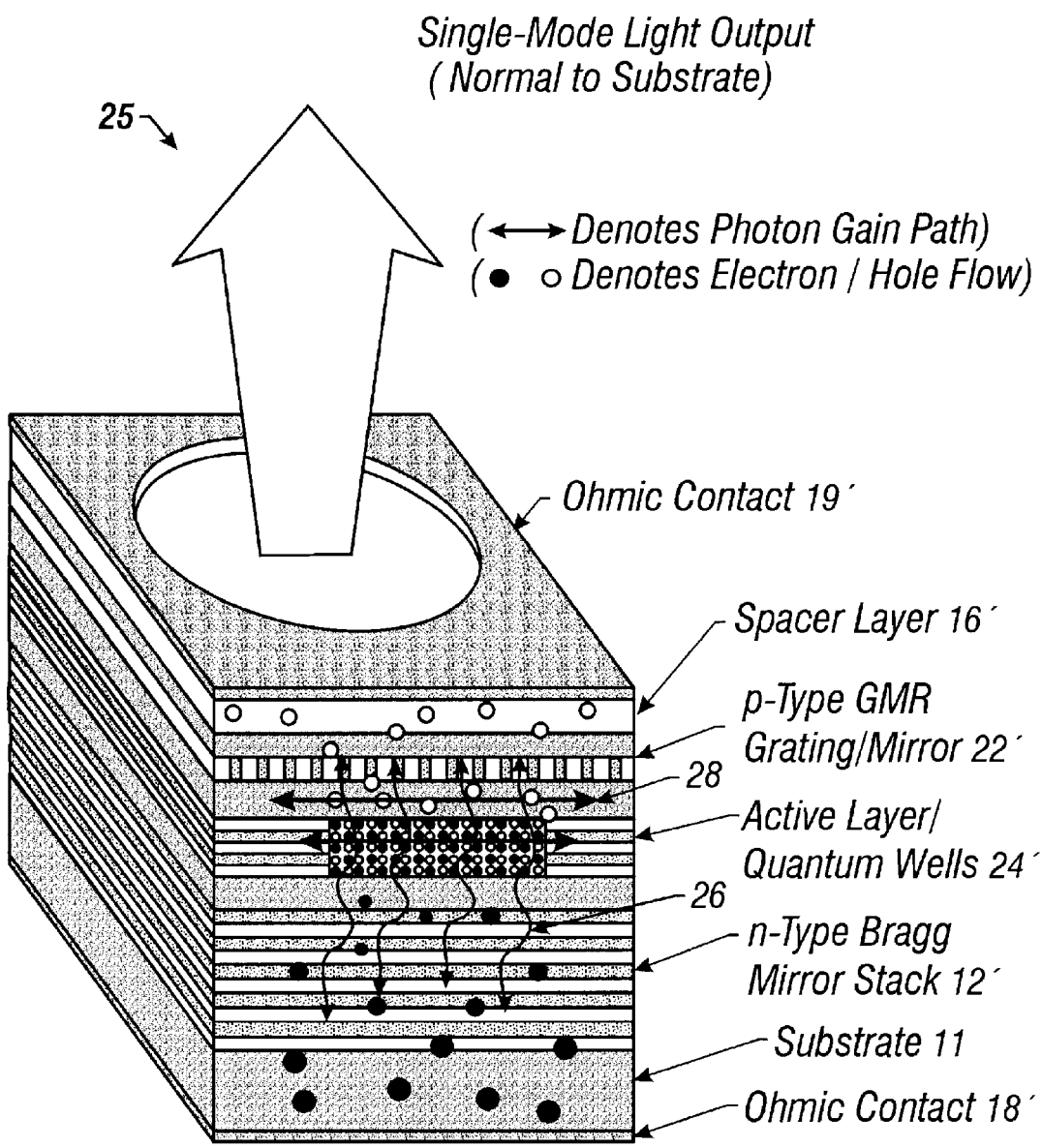
FIG. 5 illustrates a semiconductor-based application of the GMR-VCL of FIG. 2, to further illustrate the photon gain path achieved by practicing the present invention.

FIG. 5 illustrates a complete hybrid GMR-VCL device 25 using a semiconductor-based material system. The photon gain paths characteristic of the GMR-VCL device are clearly shown in FIG. 5 by the arrows 26 & 28. The traditional Bragg-stack mirrors only allow power flow across the active region. Hence, the effective round trip gain in the GMR-VCL of the present invention which incorporates a GMR mirror is greatly increased over that of the traditional VCL, resulting in higher laser efficiency. Additionally, mirror reflectivity requirements can be relaxed. Moreover, because only 2 to 3 layers are required, the time needed to grow the layers is greatly reduced; therefore, fabrication equipment stability requirements are also reduced.

It should be noted that while FIGS. 2 & 5 illustrate the light output emanating through the top mirror 22, 22' and hence the output aperture is defined in the top contact layer 19', the output aperture could alternatively be defined on the bottom of the substrate 11 for light output emanating through the lower mirror and through the substrate.

Figure 6:
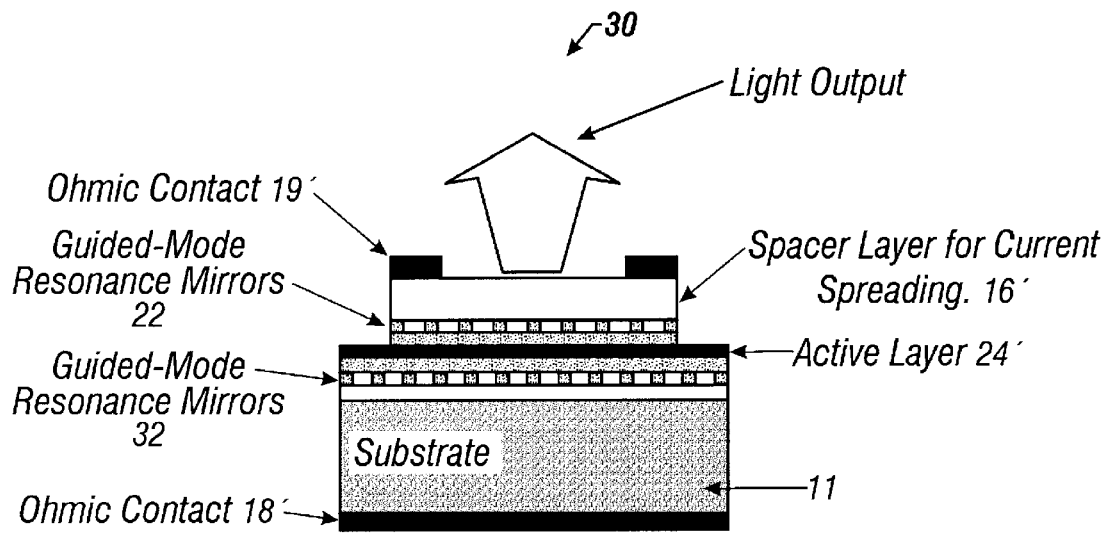
FIG. 6 illustrates, in cross-section, another GMR-VCL, in a second embodiment of the present invention.

FIG. 6 illustrates, in cross-section, another GMR-VCL 30, in a second embodiment of the present invention. In this embodiment, GMR mirrors 22 & 32 replace both Bragg-stack mirror used in the prior art. This second embodiment has some of the same advantages over the prior art as does the first embodiment, such as increased gain, lower mirror reflectivity requirements, and reduction in growth time. Moreover, this second embodiment has the additional advantages of total elimination of multilayer mirror stacks and the attendant significant reduction of total device thickness. Low threshold current, high stability laser devices can result from this embodiment. Again, the aperture for the laser output can be defined at either the top or bottom surface of the VCL, depending on the user's desired application.

Figure 7:
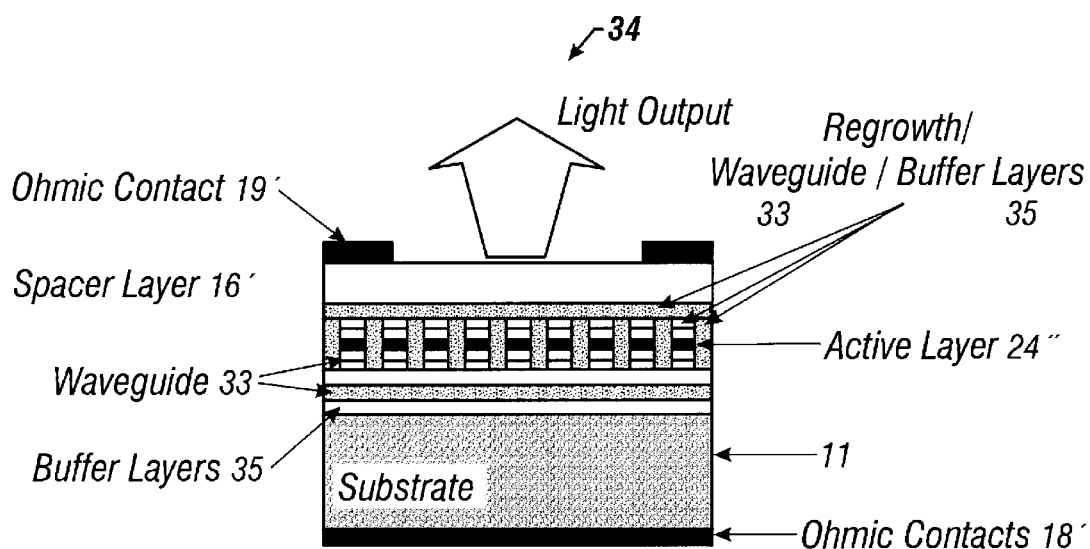
FIG. 7 illustrates, in cross-section, another GMR-VCL, in a third embodiment of the present invention.

FIG. 7 illustrates another GMR-VCL 34, in a third embodiment of the present invention. In this case, both GMR gratings and the active region are combined into a single periodic structure surrounded by appropriate waveguide 33 and thin film spacer layers 35. This embodiment allows somewhat simpler device fabrication as well as providing optimal pumping (either optical or especially by electrical current injection) of the light emitting active region. As can be seen, the active region 24" has the same period as both the upper and lower GMR gratings. This third embodiment can have the aperture for the laser output defined at either top or bottom surfaces of the device.

Figure 8:
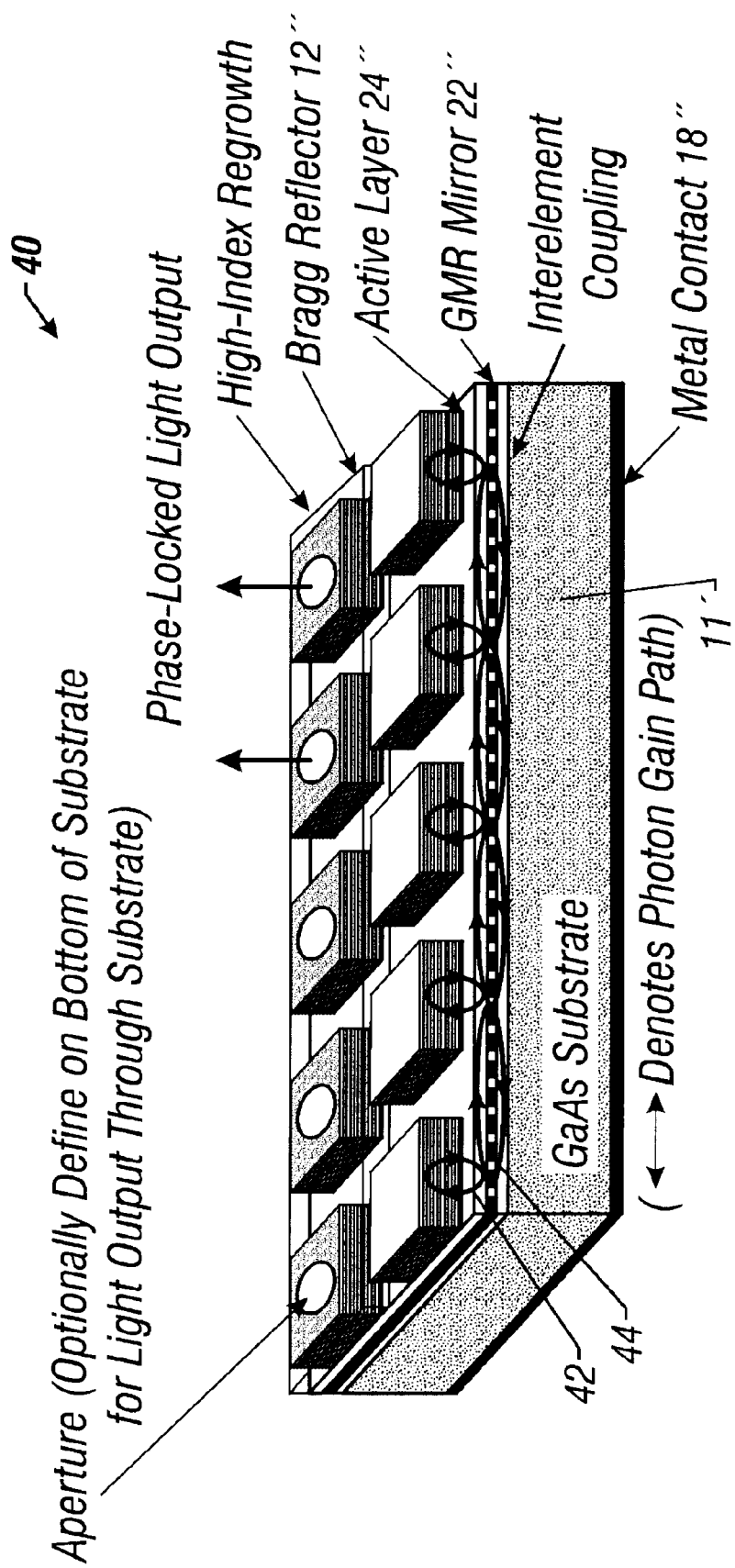
FIG. 8 illustrates a GMR-VCL array and associated photon gain paths, in a fourth embodiment of the present invention.
Figure 11:
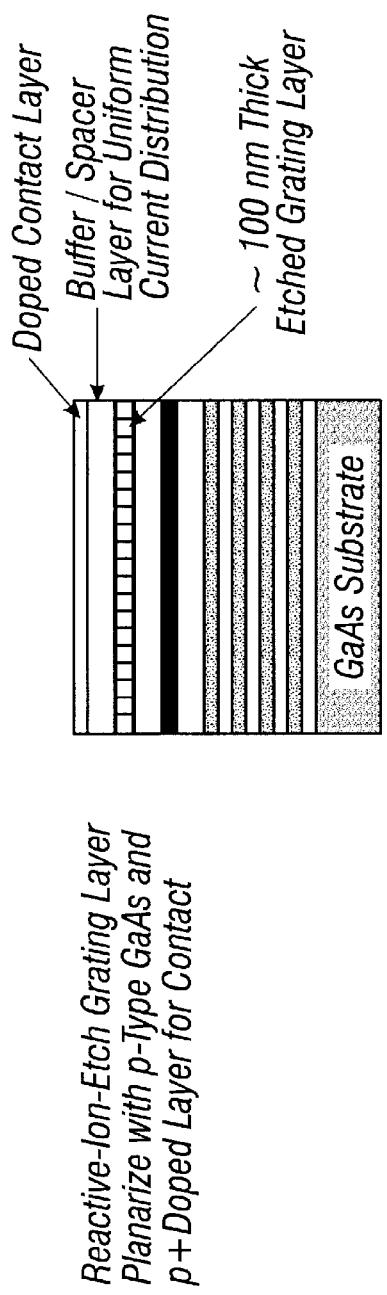
Figure 12:
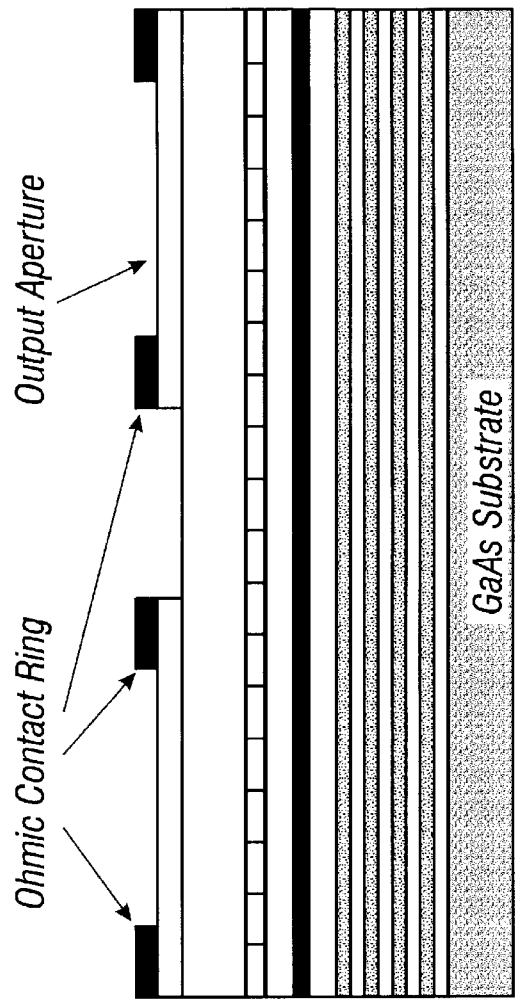
Figure 13:
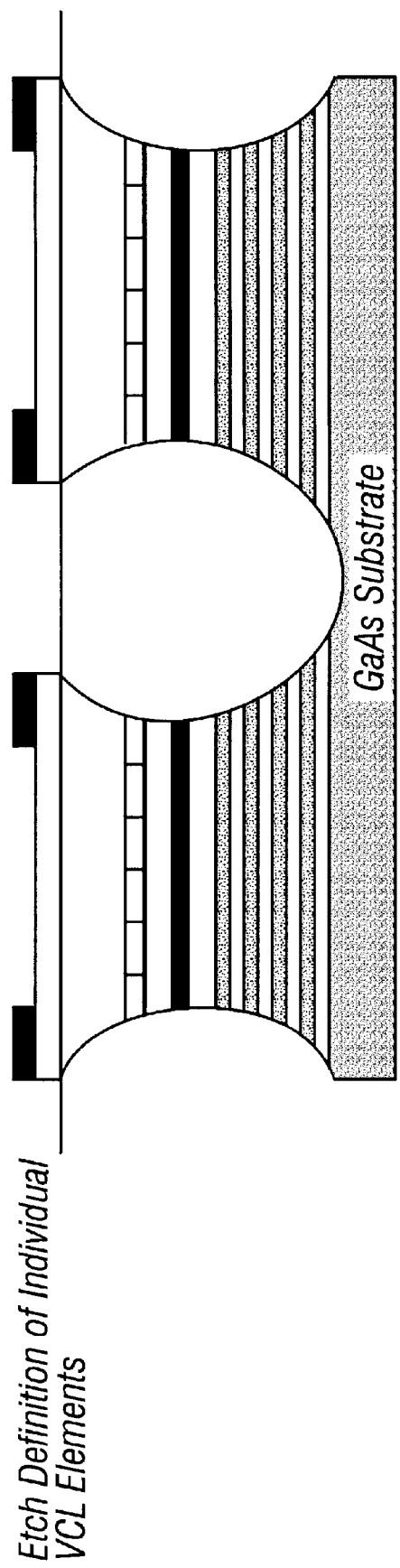

FIG. 8 illustrates a hybrid GMR-VCL array 40 comprising an improved VCL of the present invention. Because VCL laser-light emission is orthogonal to the wafer surface on which the lasers are grown, monolithic VCL-arrays can be manufactured with thousands of lasers per wafer. Moreover, these VCLs making up the array can be individually or matrix addressed. That is, each VCL in the array can operate independently of other VCLs in the array. In this instance, the GMR mirror of each VCL has its own independent resonant waveguide grating. Alternatively, several VCLs in the array can be coupled together and addressed coherently as a subgroup or all the VCLs can be coupled together and operate as a coherent group. Coupled VCLs share a continuous resonant waveguide grating in the GMR mirrors. This idea is illustrated in FIG. 8. The photon gain paths 42 & 44 are shown to denote the interaction and coupling provided by each of the VCLs in the array.

While not specifically illustrated, other variations of the GMR-VCL array are possible, using the advanced VCL devices of FIGS. 6 & 7. Numerous potential applications for VCL arrays exist in optical computing, high speed interconnection of electronic devices, and other fields. A GMR-VCL array of the present invention will provide stable phase locking of the individual lasers thus yielding high coherence and high optical output powers. Electrical addressing of component lasers may permit focusing, scanning, and beam-pointing functions to be performed.

Steps for making an improved GaAs-based GMR-VCL implementation of the present invention are illustrated as an example in FIGS. 9–13. For GaAs based devices, typical VCL development may include molecular beam epitaxial (MBE) growth of the basic planar and QW active layer GaAs-based device [Alavi 1995], interferometric recording of the GMR grating, lithographic and reactive-ion-etch (RIE) definition of the current apertures and individual VCL elements, and finally, metallization and contacting [Jewell et al. 1991]. VCL characterization may include optical spectral and power measurements [Jewell et al. 1991; Gourley et al. 1995].

The relevant typical parameters for each step are shown in the figures. However, it should be noted that these parameters may vary depending on the specific application of the GMR-VCL, materials, and fabrication equipment used. In particular, GMR effects can be incorporated into VCLs and other active devices fabricated in a variety of base material systems. Base material systems include but are not limited to III–V compounds such as InP/InGaAsP for 1100–1650 nm lasers, GaAs/InGaAs for 620–1000 nm, and GaN for ultraviolet or blue lasers. Of particular practical significance, for long-distance telecommunications, a wavelength of about 1300 nm to about 1550 nm is needed owing to the dispersion and absorption properties of glass fibers. The GMR based laser structure is equally applicable to II–IV material systems such as ZnSe and HgCdTe for device applications over a wide range of wavelengths.

GMR mirrors are also not limited to semiconductor materials. The waveguides, gratings, and thin-film layers can easily be implemented with conventional optical dielectric materials and deposition techniques.

The foregoing description and illustrations contained herein demonstrate many of the advantages associated with the present invention. In particular, it has been revealed that GMR-VCLs which incorporate guided-mode resonance effects can be built. The present invention offers significant improvements over the prior art in that it reduces the threshold gain needed for lasing. At emission levels below laser threshold, Bragg-stack mirrors allow amplification of the entire range of wavelengths emitted by the active region and encompassed by the spectral bandwidth of the Bragg-stack mirror. Once sufficient gain occurs at the preferential wavelength, optical power at that wavelength is further amplified and spontaneous emission at other wavelengths ceases. This narrowing of the emission spectral bandwidth only occurs very close to the laser threshold for conventional VCLs. In contrast, the GMR layers only allow light reflection and amplification at one specific frequency above and below the lasing threshold. Due to the narrow GMR linewidths, GMR-VCL structures inherently allow gain only over a narrow spectral bandwidth. Spontaneous emission at only one wavelength can be amplified, thus suppressing emission at other wavelengths. Furthermore, spontaneous emission in a GMR-VCL occurs within multiple gain paths thus greatly increasing the chance of producing additional stimulated emission. The net result is that the laser gain medium, even at levels below the lasing threshold, is efficiently stimulated only at the lasing wavelength. An added benefit is that mirror reflectivity requirements are reduced because the GMR-VCL structure provides an effective gain region several orders of magnitude larger than that of conventional VCLs. The increased gain of the GMR-VCL structure effectively compensates cavity losses which would degrade or even prevent laser operation in a conventional VCL structure. Yet another advantage of the present invention is that device fabrication stability requirements and growth time are also reduced.

Thus, it is apparent that there has been provided, in accordance with the invention, improved VCLs incorporating GMR effects and a method for making the same that substantially meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, incorporation of several gratings with differing periods within the GMR-VCL structure will yield lasers with multiple, well separated output wavelengths. Furthermore, by superimposing several gratings in a nonparallel fashion, i.e., with arbitrary angles between the grating vectors, multiple, well-defined laser-beam polarization states can be obtained. It is also important to note that the present invention is not limited in any way to devices requiring electrical current injection. Other mechanisms for stimulating photon emission may be possible. The GMR-VCL laser output beam characteristics are largely independent of the laser diameter. This allows fabrication of large aperture single-mode semiconductor lasers not realizable in the prior art. Therefore, it is intended that this invention encompass all such variations and modifications falling within the scope of the appended claims.

REFERENCES

The following references, to the extent that they provide exemplary procedural or other details supplementary to those set forth herein, are specifically incorporated herein by reference.

1. K. Alavi, "Molecular Beam Epitaxy," in *Handbook of Compound Semiconductors*, P. H. Holloway and G. E. McGuire editors, pp. 84–169, Noyes Publications 1995.
2. I. A. Avrutsky and V. A. Sychugov, "Reflection of a beam of finite size from a corrugated waveguide," J. Mod. Opt. 36, 1527–1539 (1989).
3. C. L. Chua, R. L. Thornton, D. W. Treat, V. K. Yang, and C. C. Dunnrowicz, "Indium tin oxide transparent electrodes for broad-area top-emitting vertical-cavity lasers fabricated using a single lithography step," IEEE Photonics Tech. Lett. 9, 551–553 (1997).
4. P. L. Gourley and M. E. Warren, "Surface-emitting semiconductor laser structures fabricated by microlithography," J. Nonlinear Opt. Phys. and Materials 4, 27–81 (1995).
5. L. Jewell, J. P. Harbison, A. Scherer, Y. H. Lee, and L. T. Florez, "Vertical-cavity surface-emitting lasers: Design, growth, fabrication, characterization," IEEE J. Quantum Electron. 27, 1332–1346 (1991).
6. R. Magnusson and S. S. Wang, "New principle for optical filters," Appl. Phys. Lett. 61, 1022–1024 (1992).
7. N. M. Margalit, S. Z. Zhang, and J. E. Bowers, "Vertical cavity lasers for telecom applications," IEEE Communication Magazine, 164–170 (1997).
8. S. S. Wang and R. Magnusson, "Design of waveguide-grating filters with symmetrical line shapes and low sidebands," Optics Lett. 19, 919–921 (1994).
9. A. Yariv, *Optical Electronics in Modern Communications*, 5th Ed., Oxford University Press, New York, 631 (1997).

What is claimed is:

1. A vertical-cavity laser (VCL) supported on a substrate and having a resonant cavity, comprising:
   a first mirror overlying the substrate for reflecting light during laser operation;
   an active region overlying the first mirror, the active region including means for photon emission during laser operation;
   a guided-mode resonance (GMR) mirror overlying the active region and having at least one resonant waveguide grating, the GMR mirror reflecting light at a resonance wavelength, and diffractively coupling oscillating laser light to a leaky waveguide mode propagating along the active region to provide optical power flow, and attendant photon gain path, both across and along the active region;
   at least one spacer layer overlying the GMR mirror for optical confinement; and
   first and second contact layers positioned on top and bottom surfaces of the vertical cavity laser for electrical contacts, one of said contact layers having an aperture for outputting a laser beam that is normal to the substrate.

2. The VCL of claim 1, wherein the first mirror is a multilayer Bragg-stack mirror.

3. The VCL of claim 1, wherein the first mirror is another GMR mirror, having its own grating, said first mirror reflecting light at the resonance wavelength.

4. The VCL of claim 3, wherein the active region is periodic, and wherein the active region and the gratings of both GMR mirrors possess the same period.

5. The VCL of claim 1, capable of outputting polarized light, wherein the at least one resonant waveguide grating of the GMR mirror comprises a grating, having a period and a thickness, and at least one homogeneous layer to tailor the resonance wavelength, polarization, and linewidth to predetermined design values.

6. The VCL of claim 1, further comprising at least one spacer layer disposed between the GMR mirror and the active region, wherein said at least one spacer layer has a thickness chosen such that the relative amount of optical power that flows orthogonal to the active region and along the active region is controllable.

7. The VCL of claim 1, further comprising at least one spacer layer disposed between the active region and the substrate to provide current spreading over the active region.

8. The VCL of claim 1, wherein said means for photon emission is characterized as at least one quantum well surrounded by appropriate barrier layers.

9. The VCL of claim 1, wherein the first mirror, the active region, the GMR mirror, the at least one spacer layer, and the substrate have at least one of the following variable parameters including thickness, grating period, permittivity of dielectric material, and level of impurity doping within each of said first mirror, said active region, said GMR mirror, said at least one spacer layer, and said substrate.

10. An array of vertical-cavity lasers (VCLs) comprising a plurality of VCLs according to claim 1, wherein each VCL in said array of VCLs is individually addressable.

11. An array of vertical-cavity lasers (VCLs) comprising a plurality of VCLs according to claim 1, wherein at least two VCLs in said array of VCLs are operable as a group.

12. The array of VCLs of claim 10, wherein at least two of the VCLs in said array of VCLs have GMR mirrors of different grating periods such that the at least two of the VCLs operate at different wavelengths.

13. The array of VCLs of claim 10, wherein the at least one resonant waveguide grating of the GMR mirror of a first VCL in said array is continuous with another resonant waveguide grating of the GMR mirror of a second VCL in said array, to couple the first and second VCLs.

14. The VCL of claim 1, capable of operating in a spectral region of about 620–1000 nm, wherein the substrate, the active region, the GMR mirror, the spacer layer, and the first and second contact layers, each comprising a combination of materials selected from a list consisting of: Al, Ga, As, and In.

15. The VCL of claim 1, capable of operating in a spectral region of about 1100–1650 nm, wherein the substrate, the active region, the GMR mirror, the spacer layer, and the first and second contact layers, each comprising a combination of materials selected from a list consisting of: In, Ga, As, and P.

16. The VCL of claim 1, comprising a semiconductor material, a dielectric material, or a combination thereof.

17. The VCL of claim 1, having a plurality of resonant waveguide gratings, wherein at least two of the plurality of resonant waveguide gratings have different periods for multi-wavelength laser operation.

18. The VCL of claim 1, wherein the GMR mirror has at least two resonant waveguide gratings with orthogonal grating vectors and appropriate periods to generate unpolarized output light.

19. The VCL of claim 1, having a plurality of resonant waveguide gratings with arbitrary angles between the grating vectors, thus being capable of radiating in a plurality of polarization states.

20. The VCL of claim 1, wherein the GMR mirror has two or more resonant waveguide gratings that are spatially phase shifted.

21. A vertical-cavity laser (VCL) supported on a substrate and having a resonant cavity, comprising:
a first guided-mode resonance (GMR) mirror overlying the substrate for reflecting light at a specific wavelength and polarization;
an active region overlying the first GMR mirror for photon emission during laser operation, the active region having at least one quantum well surrounded by appropriate barrier layers;
a second GMR mirror overlying the active region and having at least one resonant waveguide grating, the second GMR mirror reflecting light at the specific wavelength, and diffractively coupling oscillating laser light to a leaky waveguide mode propagating along the active region to provide optical power flow, and attendant photon gain path, both across and along the active region;
at least one spacer layer overlying the GMR mirror for optical confinement; and
first and second contact layers positioned on top and bottom surfaces of the vertical cavity laser for electrical contacts, one of said contact layers having an aperture for outputting a polarized single-mode laser beam that is normal to the substrate.

22. The VCL of claim 21, wherein the at least one resonant waveguide grating of the second GMR mirror comprises a grating, having a period and a thickness, and at least one homogeneous layer to tailor the specific wavelength, polarization, and linewidth to predetermined design values.

23. The VCL of claim 21, wherein the active region is periodic and is integrated with the first and second GMR mirrors with appropriate spacer layers.

24. The VCL of claim 23, wherein the active region and the gratings of both GMR mirrors possess the same period.

25. The VCL of claim 21, wherein the first GMR mirror, the active region, the second GMR mirror, the at least one spacer layer, and the substrate have at least one of the following variable parameters including thickness, grating period, permittivity of dielectric material, and level of impurity doping within each of said first GMR mirror, said active region, said second GMR mirror, said at least one spacer layer, and said substrate.

26. The VCL of claim 21, capable of operating in a spectral region of about 620–1000 nm, wherein the substrate, the active region, the first and second GMR mirrors, the spacer layer, and the first and second contact layers, each comprising a combination of materials selected from a list consisting of: Al, Ga, As, and In.

27. The VCL of claim 21, capable of operating in a spectral region of about 1100–1650 nm, wherein the substrate, the active region, the first and second GMR mirrors, the spacer layer, and the first and second contact layers, each comprising a combination of materials selected from a list consisting of: In, Ga, As, and P.

28. A vertical-cavity laser (VCL) supported on a substrate and having a resonant cavity, comprising:
a multilayer Bragg-stack mirror overlying the substrate for reflecting light during laser operation;
an active region overlying the multilayer Bragg-stack mirror for photon emission during laser operation, the active region having at least one quantum well surrounded by appropriate barrier layers;
a guided-mode resonance (GMR) mirror overlying the active region and having at least one resonant waveguide grating, the GMR mirror reflecting light at a specific wavelength, and diffractively coupling oscillating laser light to a leaky waveguide mode propagating along the active region to provide optical power flow, and attendant photon gain path, both across and along the active region;
at least one spacer layer overlying the GMR mirror for optical confinement; and
first and second contact layers positioned on top and bottom surfaces of the vertical cavity laser for electrical contacts, one of said contact layers having an aperture for outputting a polarized single-mode laser beam that is normal to the substrate.

29. The vertical cavity laser of claim 28, wherein the Bragg-stack mirror and the GMR mirror overlap spectrally in the active region.

30. The VCL of claim 28, wherein the Bragg-stack mirror, the active region, the GMR mirror, the at least one spacer layer, and the substrate have at least one of the following variable parameters including thickness, grating period, permittivity of dielectric material, and level of impurity doping within each of said Bragg-stack mirror, said active region, said GMR mirror, said at least one spacer layer, and said substrate.

31. The VCL of claim 28, capable of operating in a spectral region of about 620–1000 nm, wherein the substrate, the active region, the GMR mirror, the spacer layer, and the first and second contact layers, each comprising a combination of materials selected from a list consisting of: Al, Ga, As, and In.

32. The VCL of claim 28, capable of operating in a spectral region of about 1100–1650 nm, wherein the substrate, the active region, the GMR mirror, the spacer layer, and the first and second contact layers, each comprising a combination of materials selected from a list consisting of: In, Ga, As, and P.

* * * * *